(12) United States Patent
Zhang et al.

(10) Patent No.: US 8,949,704 B2
(45) Date of Patent: Feb. 3, 2015

(54) SYSTEMS AND METHODS FOR MIS-CORRECTION CORRECTION IN A DATA PROCESSING SYSTEM

(75) Inventors: Fan Zhang, Milpitas, CA (US); Bruce A. Wilson, San Jose, CA (US); Yang Han, Sunnyvale, CA (US); Chung-Li Wang, San Jose, CA (US); Shaohua Yang, San Jose, CA (US)

(73) Assignee: LSI Corporation, San Jose, CA (US)

( * ) Notice: Subject to any disclaimer, the term of this patent is extended or adjusted under 35 U.S.C. 154(b) by 317 days.

(21) Appl. No.: 13/426,722

(22) Filed: Mar. 22, 2012

(65) Prior Publication Data

US 2013/0254619 A1    Sep. 26, 2013

(51) Int. Cl.
| | |
|---|---|
| H04L 1/00 | (2006.01) |
| H04L 25/497 | (2006.01) |
| H03M 13/29 | (2006.01) |
| G06F 11/10 | (2006.01) |
| H04L 25/49 | (2006.01) |

(52) U.S. Cl.
CPC ............ *H04L 25/497* (2013.01); *H03M 13/29* (2013.01); *G06F 11/1076* (2013.01); *H04L 25/4917* (2013.01)
USPC ............................ 714/810; 714/752; 714/755

(58) Field of Classification Search
CPC . H03M 13/2957; H03M 13/29; H03M 13/27; H03M 13/2906; H03M 13/1111; H03M 13/6343; H03M 13/715; H03M 13/6331; G11B 20/1833; G11B 20/1496; G06F 11/1076; H04L 25/497; H04L 25/4917; H04L 25/4925; H04L 1/247; H04L 1/1004

USPC .................. 714/755, 752, 795, 810, 809
See application file for complete search history.

(56) References Cited

U.S. PATENT DOCUMENTS

| | | | | |
|---|---|---|---|---|
| 5,696,774 | A * | 12/1997 | Inoue et al. | 714/755 |
| 8,018,360 | B2 * | 9/2011 | Nayak | 341/118 |
| 2005/0060630 | A1 * | 3/2005 | Hassner et al. | 714/758 |
| 2005/0166132 | A1 * | 7/2005 | Shen et al. | 714/801 |
| 2007/0104300 | A1 * | 5/2007 | Esumi et al. | 375/346 |
| 2008/0034272 | A1 * | 2/2008 | Wu et al. | 714/763 |
| 2010/0042890 | A1 | 2/2010 | Gunnam et al. | |
| 2010/0088575 | A1 * | 4/2010 | Sharon et al. | 714/763 |
| 2011/0029826 | A1 * | 2/2011 | Zhong et al. | 714/704 |
| 2011/0109773 | A1 * | 5/2011 | Dekel | 348/241 |
| 2011/0161774 | A1 * | 6/2011 | Shin et al. | 714/755 |
| 2011/0164745 | A1 * | 7/2011 | Marzetta et al. | 380/28 |
| 2012/0005551 | A1 | 1/2012 | Gunnam et al. | |
| 2012/0288003 | A1 * | 11/2012 | Do et al. | 375/240.16 |
| 2013/0086446 | A1 * | 4/2013 | Yeung et al. | 714/755 |

OTHER PUBLICATIONS

Kang et al., "A Two-Stage Iterative Decoding of LDPC Codes for Lowering Error Floors", IEEE GLOBECOM Proceedings, 1088-1091 (2008).

Lin et al "An efficient VLSI Architecture for non binary LDPC decoders"—IEEE Transaction on Circuits and Systems II vol. 57, Issue 1 (Jan. 2010) pp. 51-55.

(Continued)

*Primary Examiner* — Albert Decady
*Assistant Examiner* — Osman Alshack
(74) *Attorney, Agent, or Firm* — Hamilton DeSanctis & Cha

(57) ABSTRACT

The present inventions are related to systems and methods for data processing, and more particularly to systems and methods for mis-correction detection and correction in a data processing system.

20 Claims, 5 Drawing Sheets

(56) References Cited

OTHER PUBLICATIONS

Perisa et al "Frequency Offset Estimation Based on Phase Offsets Between Sample Correlations" Dept. of Info. Tech. University of Ulm 2005.

U.S. Appl. No. 13/363,751, Unpublished (filed Feb. 1, 2012) (Lei Chen).
U.S. Appl. No. 13/284,754, Unpublished (filed Oct. 28, 2011) (Fan Zhang).

* cited by examiner

SYSTEMS AND METHODS FOR MIS-CORRECTION CORRECTION IN A DATA PROCESSING SYSTEM

BACKGROUND OF THE INVENTION

The present inventions are related to systems and methods for data processing, and more particularly to systems and methods for mis-correction detection in a data processing system.

Various data transfer systems have been developed including storage systems, cellular telephone systems, and radio transmission systems. In each of the systems data is transferred from a sender to a receiver via some medium. For example, in a storage system, data is sent from a sender (i.e., a write function) to a receiver (i.e., a read function) via a storage medium. In some cases, the data processing function receives data sets and applies a data decode algorithm to the data sets to recover an originally written data set. In some cases, application of the data decoding process provides a correct results for internal decoder metrics suggesting that the result is correct when in fact it is not. Such mis-corrections can be difficult to detect and may be fatal to the operation of a recipient device.

Hence, for at least the aforementioned reasons, there exists a need in the art for advanced systems and methods for data processing.

BRIEF SUMMARY OF THE INVENTION

The present inventions are related to systems and methods for data processing, and more particularly to systems and methods for mis-correction detection in a data processing system.

Various embodiments of the present invention provide data processing systems that include a multi-level decoder circuit. The multi-level decoder circuit includes a first decoder circuit operable to apply a first decoding algorithm to a decoder input guided by a first portion of a composite matrix to yield an interim output, and a second decoder circuit operable to apply a second decoding algorithm decoded by a second portion of the composite matrix to yield a decoded output. Application of the second decoding algorithm is operable to correct at least one mis-correction in the interim output. In some instances of the aforementioned embodiments, the system is implemented as an integrated circuit. In various instances of the aforementioned embodiments, the data processing system is incorporated in, for example, a storage device, or a communication device.

In particular instances of the aforementioned embodiments, the second portion of the matrix exhibits the smallest number of error detection bits for a given number of sparse vectors. In some cases, the second portion of the matrix is more than twice as dense at the first portion of the matrix. In one or more instances of the aforementioned embodiments, the second decoding algorithm is a compressed sensing algorithm. In some such instances, the compressed sensing algorithm operates to identify a vector e that corresponds to the minimum number for the normal vector in satisfaction of the following mathematical identity:

$$\arg\min_{e:e\phi=y}\|e\|_{l_0},$$

where $\phi$ represents the second portion of the matrix. In one or more instances of the aforementioned embodiments, the first decoding algorithm is a low density parity check encoding algorithm.

In some instances of the aforementioned embodiments, the system further includes a data detector circuit operable to apply a data detection algorithm to an input data set to yield a detected output. The decoder input is derived from the detected output. In such instances, the data detection algorithm may be, but is not limited to, a Viterbi algorithm detection algorithm, or a maximum a posteriori data detection algorithm. In particular instances of the aforementioned embodiments where the matrix is an H-matrix, the systems may further include an encoding circuit operable to encode a received data set using a composite G-matrix corresponding to the composite H-matrix to yield a codeword. In some such systems, the decoder input is derived from the codeword.

Other embodiments of the present invention provide methods for data processing that include: receiving a decoder input; applying a first data decode algorithm to the decoder input guided by a first portion of a composite matrix to yield an interim output; determining that the interim output converged; and applying a second decoding algorithm decoded by a second portion of the composite matrix to yield a decoded output. Application of the second decoding algorithm is operable to correct at least one mis-correction in the interim output. In some cases, the interim output includes correction data, and the methods further include using the correction data to determine that at least one mis-correction exists in the interim output. In one or more cases, the second portion of the matrix exhibits the smallest number of error detection bits for a given number of sparse vectors, and the second portion of the matrix is more than twice as dense at the first portion of the matrix. In particular cases, the second decoding algorithm is a compressed sensing algorithm that operates to identify a vector e that corresponds to the minimum number for the normal vector in satisfaction of the following mathematical identity:

$$\arg\min_{e:e\phi=y}\|e\|_{l_0},$$

where $\phi$ represents the second portion of the matrix.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present inventions are related to systems and methods for data processing, and more particularly to systems and methods for mis-correction detection in a data processing system.

Various embodiments of the present invention provide for data processing that includes mis-correction detection and modification. Such embodiments utilize a compressed sensing algorithm to detect mis-correction, and a mis-correction tailored portion of an H-matrix to correct the mis-corrections. In some cases, such an approach allows for detecting and correcting mis-corrections without requiring cumbersome and time consuming list searches. Based upon the disclosure provided herein, one of ordinary skill in the art will recognize a variety of advantages that may be achieved in place of or in addition to the aforementioned advantage using the various embodiments of the present invention. In some embodiments of the present invention, a data processing system including a multi-level data decoder circuit is used. The multi-level data decoder circuit is implemented to include compressed sensing circuitry operable to detect mis-correction, and where mis-correction is detected, to correct the mis-correction.

Figure 1:
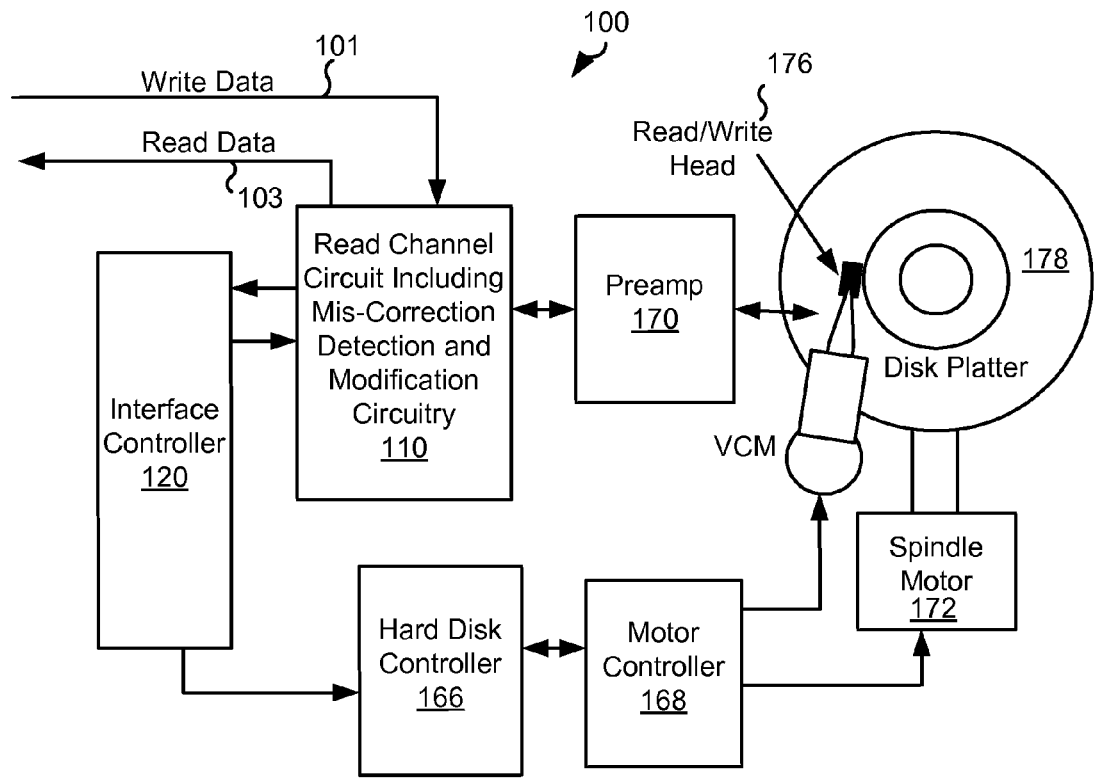
FIG. 1 shows a storage system including mis-correction detection and modification circuitry in accordance with various embodiments of the present invention.

Turning to FIG. 1, a storage system 100 including a read channel circuit 110 having mis-correction detection and modification circuitry is shown in accordance with various embodiments of the present invention. Storage system 100 may be, for example, a hard disk drive. Storage system 100 also includes a preamplifier 170, an interface controller 120, a hard disk controller 166, a motor controller 168, a spindle motor 172, a disk platter 178, and a read/write head 176. Interface controller 120 controls addressing and timing of data to/from disk platter 178. The data on disk platter 178 consists of groups of magnetic signals that may be detected by read/write head assembly 176 when the assembly is properly positioned over disk platter 178. In one embodiment, disk platter 178 includes magnetic signals recorded in accordance with either a longitudinal or a perpendicular recording scheme.

In operation, read/write head assembly 176 is accurately positioned by motor controller 168 over a desired data track on disk platter 178. Motor controller 168 both positions read/write head assembly 176 in relation to disk platter 178 and drives spindle motor 172 by moving read/write head assembly to the proper data track on disk platter 178 under the direction of hard disk controller 166. Spindle motor 172 spins disk platter 178 at a determined spin rate (RPMs). Once read/write head assembly 176 is positioned adjacent the proper data track, magnetic signals representing data on disk platter 178 are sensed by read/write head assembly 176 as disk platter 178 is rotated by spindle motor 172. The sensed magnetic signals are provided as a continuous, minute analog signal representative of the magnetic data on disk platter 178. This minute analog signal is transferred from read/write head assembly 176 to read channel circuit 110 via preamplifier 170. Preamplifier 170 is operable to amplify the minute analog signals accessed from disk platter 178. In turn, read channel circuit 110 decodes and digitizes the received analog signal to recreate the information originally written to disk platter 178. This data is provided as read data 103.

As part of processing data accessed from disk platter 178, read channel circuit 110 performs a data decode that includes mis-correction detection and modification. In some cases, read channel circuit 110 may include a data processing circuit similar to that discussed below in relation to FIGS. 3a-3b, and/or may apply data processing similar to that discussed below in relation to FIGS. 4a-4b.

It should be noted that storage system 100 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 100, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

A data decoder circuit used in relation to read channel circuit 110 may be, but is not limited to, a low density parity check (LDPC) decoder circuit as are known in the art. Such low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

Figure 2:
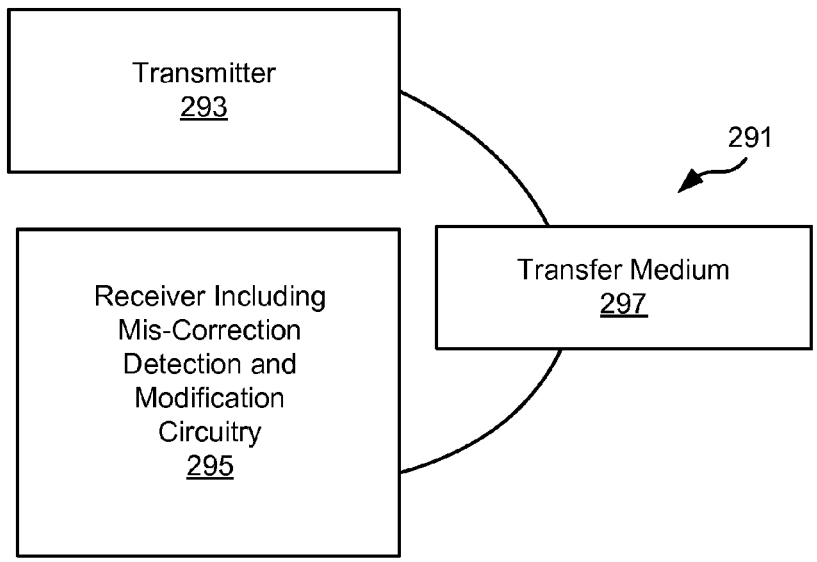
FIG. 2 depicts a data transmission system including mis-correction detection and modification circuitry in accordance with one or more embodiments of the present invention.

Turning to FIG. 2, a data transmission system 291 including a receiver 295 having mis-correction detection and modification circuitry is shown in accordance with various embodiments of the present invention. Data transmission system 291 includes a transmitter 293 that is operable to transmit encoded information via a transfer medium 297 as is known in the art. The encoded information is received from transfer medium 297 by a receiver 295. Receiver 295 processes a received input representing the encoded information to yield the originally transmitted data. As part of processing the received input, receiver 295 performs a data decode that includes mis-correction detection and modification. In some cases, receiver 295 may include a data processing circuit similar to that discussed below in relation to FIG. 3a-3b, and/or may apply data processing similar to that discussed below in relation to FIGS. 4a-4b.

Figure 3A:
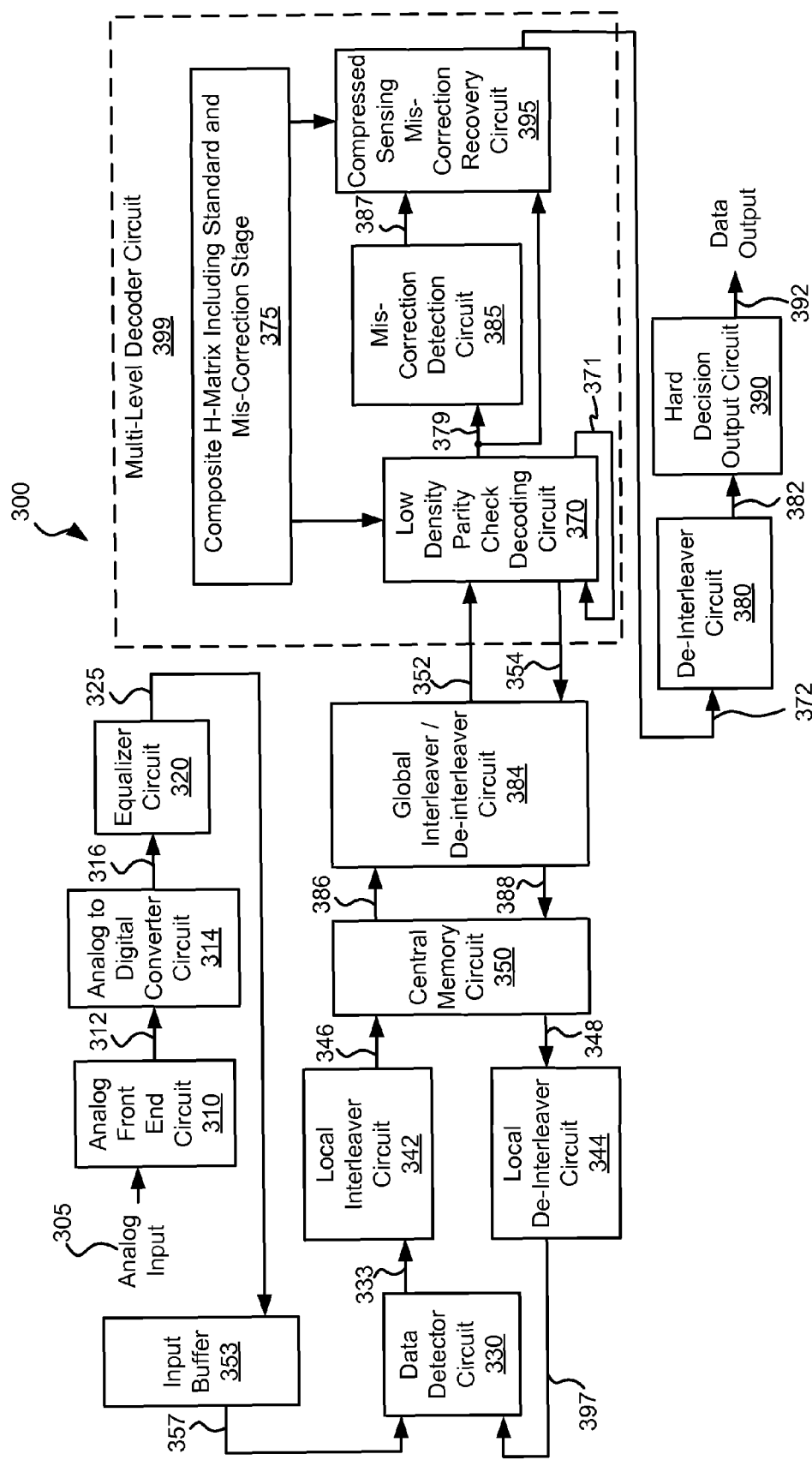
FIG. 3a shows a data processing circuit operable to apply mis-correction detection and modification in accordance with some embodiments of the present invention.

Turning to FIG. 3a, a data processing circuit 300 operable to apply mis-correction detection and modification in accordance with some embodiments of the present invention. Data decoding circuit 300 includes an analog front end circuit 310 that receives an analog signal 305. Analog front end circuit 310 processes analog signal 305 and provides a processed analog signal 312 to an analog to digital converter circuit 314. Analog front end circuit 310 may include, but is not limited to, an analog filter and an amplifier circuit as are known in the art. Based upon the disclosure provided herein, one of ordinary skill in the art will recognize a variety of circuitry that may be included as part of analog front end circuit 310. In some cases, analog signal 305 is derived from a read/write head assembly (not shown) that is disposed in relation to a storage medium (not shown). In other cases, analog signal 305 is derived from a receiver circuit (not shown) that is operable to receive a signal from a transmission medium (not shown). The transmission medium may be wired or wireless. Based upon the disclosure provided herein, one of ordinary skill in the art will recognize a variety of source from which analog input 305 may be derived.

Analog to digital converter circuit 314 converts processed analog signal 312 into a corresponding series of digital samples 316. Analog to digital converter circuit 314 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 316 are provided to an equalizer circuit 320. Equalizer circuit 320 applies an equalization algorithm to digital samples 316 to yield an equalized output 325. In some embodiments of the present invention, equalizer circuit 320 is a digital finite impulse response filter circuit as are known in the art. It may be possible that equalized output 325 may be received directly from a storage device in, for example, a solid state storage system. In such cases, analog front end circuit 310, analog to digital converter circuit 314 and equalizer circuit 320 may be eliminated where the data is received as a digital data input.

Equalized output 325 is stored to an input buffer 353 that includes sufficient memory to maintain one or more codewords until processing of that codeword is completed through a data detector circuit 330 and a multi-level decoder circuit 399 (outlined by dashed lines) including, where warranted, multiple global iterations (passes through both data detector circuit 330 and multi-level decoder circuit 399) and/or local iterations (passes through multi-level decoder circuit 399 during a given global iteration). An output 357 is provided to data detector circuit 330.

Data detector circuit 330 may be a single data detector circuit or may be two or more data detector circuits operating in parallel on different codewords. Whether it is a single data detector circuit or a number of data detector circuits operating in parallel, data detector circuit 330 is operable to apply a data detection algorithm to a received codeword or data set. In some embodiments of the present invention, data detector circuit 330 is a Viterbi algorithm data detector circuit as are known in the art. In other embodiments of the present invention, data detector circuit 330 is a maximum a posteriori data detector circuit as are known in the art. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or bi-direction Viterbi algorithm detector circuit. Also, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present invention. In some cases, one data detector circuit included in data detector circuit 330 is used to apply the data detection algorithm to the received codeword for a first global iteration applied to the received codeword, and another data detector circuit included in data detector circuit 430 is operable apply the data detection algorithm to the received codeword guided by a decoded output accessed from a central memory circuit 450 on subsequent global iterations.

Upon completion of application of the data detection algorithm to the received codeword on the first global iteration, data detector circuit 330 provides a detector output 333. Detector output 333 includes soft data. As used herein, the phrase "soft data" is used in its broadest sense to mean reliability data with each instance of the reliability data indicating a likelihood that a corresponding bit position or group of bit positions has been correctly detected. In some embodiments of the present invention, the soft data or reliability data is log likelihood ratio data as is known in the art. Detected output 333 is provided to a local interleaver circuit 342. Local interleaver circuit 342 is operable to shuffle sub-portions (i.e., local chunks) of the data set included as detected output and provides an interleaved codeword 346 that is stored to central memory circuit 350. Interleaver circuit 342 may be any circuit known in the art that is capable of shuffling data sets to yield a re-arranged data set. Interleaved codeword 346 is stored to central memory circuit 350.

Once a multi-level data decoder circuit 399 is available, a previously stored interleaved codeword 346 is accessed from central memory circuit 350 as a stored codeword 386 and globally interleaved by a global interleaver/de-interleaver circuit 384. Global interleaver/De-interleaver circuit 384 may be any circuit known in the art that is capable of globally rearranging codewords. Global interleaver/De-interleaver circuit 384 provides a decoder input 352 into multi-level data decoder circuit 399. Multi-level data decoder circuit 399 performs data decoding based upon a composite H-Matrix 375 that includes both a standard decoding and a mis-correction tailored stage ($\phi$). Initially, a low density parity check decoding circuit 370 applies a low density parity check decode algorithm to decoder input 352. In addition, multi-level data decoder circuit 399 includes a mis-correction detection circuit 385 and a compressed sensing based mis-correction recovery circuit 395.

Figure 3B:
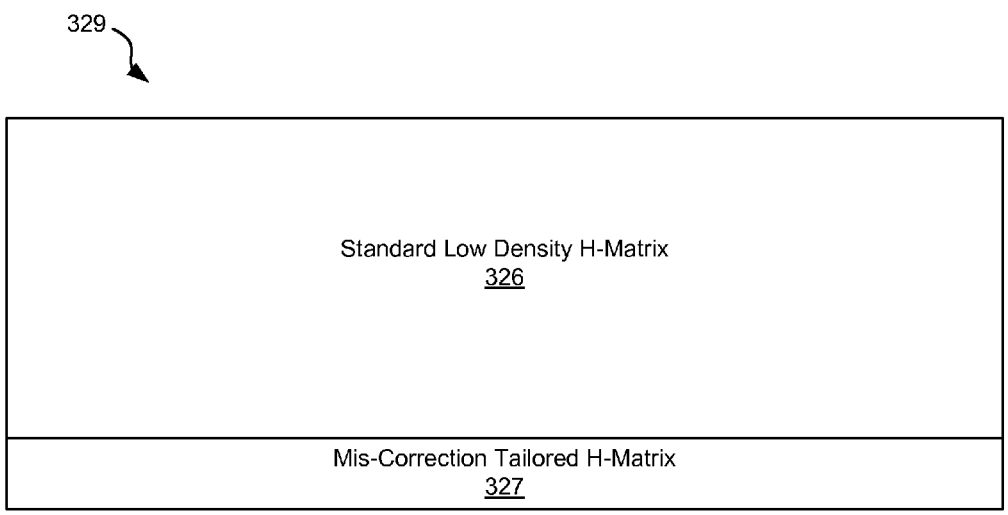
FIGS. 3b shows an example H-matrix including both a standard stage and a mis-correction stage in accordance with one or more embodiments of the present invention.

An example of composite H-matrix 375 including both a standard decoding and a mis-correction tailored stage ($\phi$) is shown in FIG. 3b. Turning to FIG. 3b, an example H-matrix 329 includes a standard low density H-matrix 326 that is used by a low density parity check decoder circuit to apply a low density parity check algorithm to a codeword. The standard low density H-matrix 326 may be any H-matrix known in the art. Additionally, H-matrix 329 includes a mis-correction tailored H-matrix 327 that is used to apply a secondary decoding algorithm to correct any identified mis-corrections. The mis-correction tailored H-matrix 327 us designed such that it has the smallest m (m corresponds to the number of cyclic redundancy correction bits included in the data) and can recover up to a defined number (k) sparse vectors. In some embodiments of the present invention, mis-correction tailored H-matrix 327 is more than twice as dense (i.e., more than twice as many 1's to 0's) as standard low density H-matrix 326.

Returning to FIG. 3a, initial application of the low density parity check decode algorithm is applied by low density parity check decoding circuit 370 to decoder input 352 to yield an interim decoded output 379. Application of the low density parity check decode algorithm relies on a standard stage of H-matrix. Where interim decoded output 379 fails to converge, it is determined whether another local iteration (i.e., another pass through data decoder circuit 370) of the low density parity check decode algorithm is to be applied. Where another local iteration is to be applied, interim decoded output 379 is provided as a feedback 371 to low density parity check decoding circuit 370. This continues until either a maximum number of local iterations is exceeded or interim decoded output 379 converges. Such convergence of interim decoded output 379 is found where all of the parity check equations applied by low density parity check decoding circuit 370 are satisfied.

Where interim decoded output 379 fails to converge and a number of local iterations through low density parity check decoding circuit 370 exceeds a threshold, the resulting interim decoded output is provided as a decoded output 354 back to central memory circuit 350 where it is stored awaiting another global iteration through a data detector circuit included in data detector circuit 330. Prior to storage of decoded output 354 to central memory circuit 350, decoded output 354 is globally de-interleaved to yield a globally de-interleaved output 388 that is stored to central memory circuit 350. The global de-interleaving reverses the global interleaving earlier applied to stored codeword 386 to yield decoder input 352. When a data detector circuit included in data detector circuit 330 becomes available, a previously stored de-interleaved output 388 accessed from central memory circuit 350 and locally de-interleaved by a de-interleaver circuit 344. De-interleaver circuit 344 re-arranges decoder output 348 to reverse the shuffling originally performed by interleaver circuit 342. A resulting de-interleaved output 397 is provided to data detector circuit 330 where it is used to guide subsequent detection of a corresponding data set previously received as equalized output 325.

Alternatively, where interim decoded output 379 converges it is provided to a mis-correction detection circuit 385 that is operable to detect any mis-correction in the converged output. In some embodiments of the present invention, mis-correction detection circuit 385 applies a number of cyclic redundancy check information, or other additional parity check information included in the data. Where an error is identified using the information in the data, a mis-correction is indicated by asserting a mis-correction signal 387. Where no error is identified, mis-correction signal 387 is de-asserted. Mis-correction signal 387 is provided to compressed sensing based mis-correction recovery circuit 395. Where mis-correction signal 387 is de-asserted indicating that no error was identified by mis-correction detection circuit 385, compressed sensing based mis-correction recovery circuit 395 provides interim decoded output 379 as an output codeword 372 to a de-interleaver circuit 380. De-interleaver circuit 380 rearranges the data to reverse both the global and local interleaving applied to the data to yield a de-interleaved output 382. De-interleaved output 382 is provided to a hard decision output circuit 390. Hard decision output circuit 390 is operable to re-order data sets that may complete out of order back into their original order, with the originally ordered data sets being provided as a data output 392.

Alternatively, where mis-correction signal 387 is asserted indicating that one or more mis-correction errors were identified by mis-correction detection circuit 385, compressed sensing based mis-correction recovery circuit 395 applies the secondary decoding algorithm to correct the identified mis-corrections. The secondary decoding algorithm relies on the mis-correction tailored stage ($\phi$) of composite H-matrix 375. The compressed sensing operates to determine which sparse solution to the following equation $$\arg\min_{e:e\phi=y}\|e\|_{l_0}$$

for the vector e that yields the minimum value of the zero norm or norm vector $l_0$ (i.e., the minimum number of non-zero elements in e). The aforementioned mathematical identity finds the error vector (e) with minimum weight, such that the cyclic redundancy check is satisfied. The vector e corresponds to vectors that are permutations of interim decoded output 379 including different numbers of mis-corrections. The vector e that exhibits the lowest value $l_0$ corresponds to the correct output. As an example of using this equation, true codeword (c0) must satisfy cyclic redundancy check, i.e., $c0*\phi=0$. Where at the end of decoding through low density parity check decoding circuit 370 a mis-corrected codeword (c1) results that satisfies all of the parity checks, but this mis-corrected codeword (c1) does not satisfy the cyclic redundancy checks tested by compressed sensing based mis-correction detection circuit 385 (i.e., $c1*\phi=y$, and y is non-zero). Mis-correction recovery circuit 395 finds the minimum error vector e (i.e., the weight that corresponds to the most likely result), which cancels the y so that the cyclic redundancy checks are satisfied after adding c1 and e together. The term 'y' corresponds to the signature of the cyclic redundancy correction check information. In this equation, $\phi$ is the mis-correction tailored stage of composite H-matrix 375. This minimum corresponds to the minimum number (m) of cyclic redundancy cyclic check bits included in interim decoded output 379. For this to work, the mis-correction tailored stage ($\phi$) of composite H-matrix 375 is designed such that it exhibits the smallest m that is capable of recovering up to k sparse vectors. The value for the determined vector e plus the originally identified mis-corrected output (i.e., interim decoded output 379 plus e) is provided by compressed sensing mis-correction recovery circuit 395 as output codeword 372 to de-interleaver circuit 380. As previously described, de-interleaver circuit 380 rearranges the data to reverse both the global and local interleaving applied to the data to yield de-interleaved output 382, and de-interleaved output 382 is provided to hard decision output circuit 390 that is operable to re-order data sets that may complete out of order back into their original order, with the originally ordered data sets being provided as a data output 392.

Any of a number of algorithms known in the art that are capable of solving or estimating the above mentioned norm vector $l_0$. For example, in one embodiment of the present invention, a basis pursuit algorithm as is known in the art is used to determine the value of the norm vector $l_0$. Based upon the disclosure provided herein, one of ordinary skill in the art will recognize other algorithms that may be used in relation to different embodiments of the present invention.

Figure 4A:
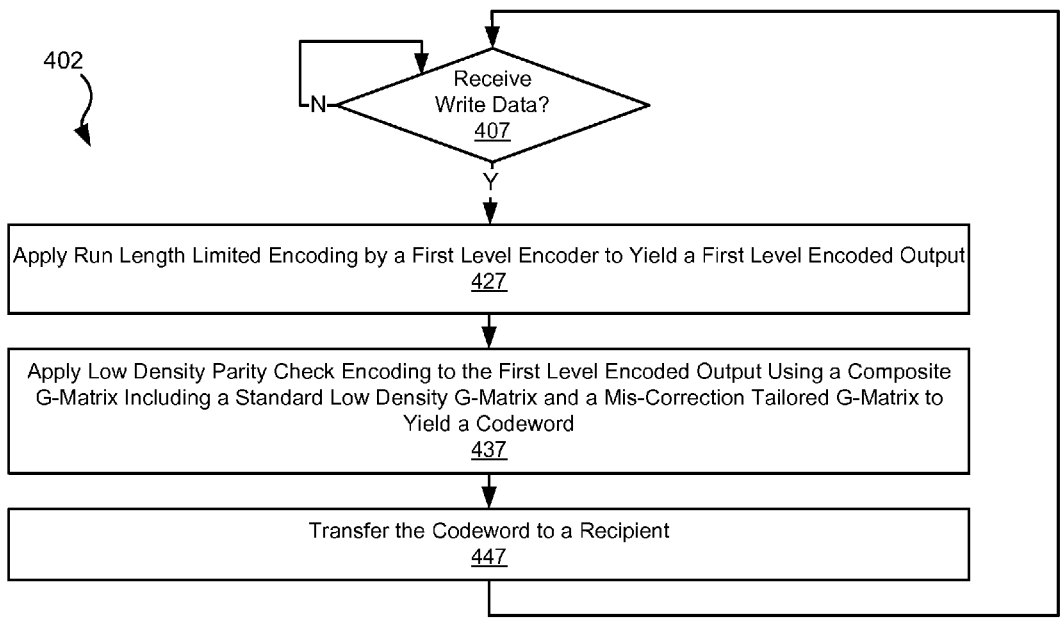
FIGS. 4a-4c are flow diagrams showing a method for data processing utilizing mis-correction detection and modification in accordance with some embodiments of the present invention.
Figure 4B:
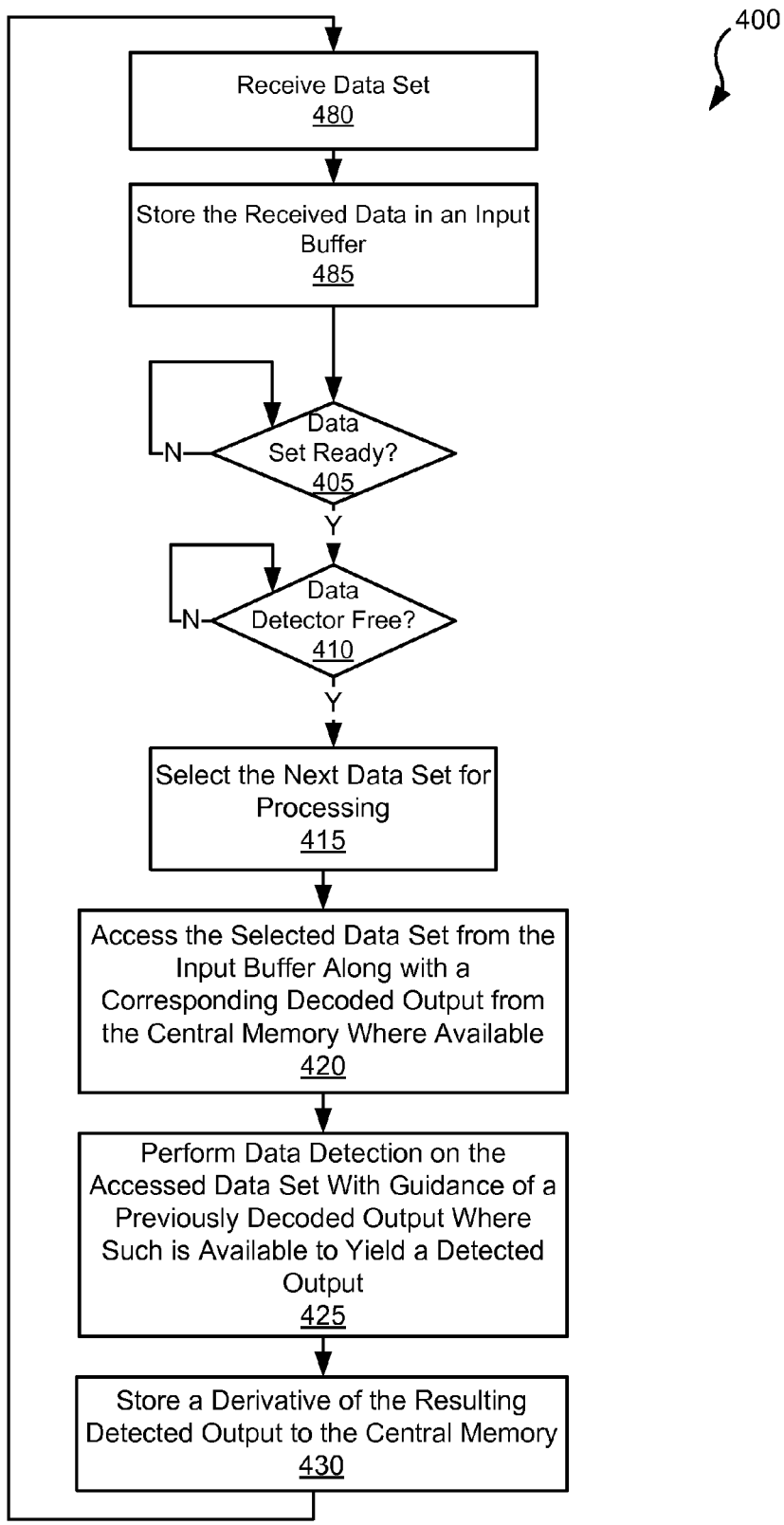
Figure 4C:
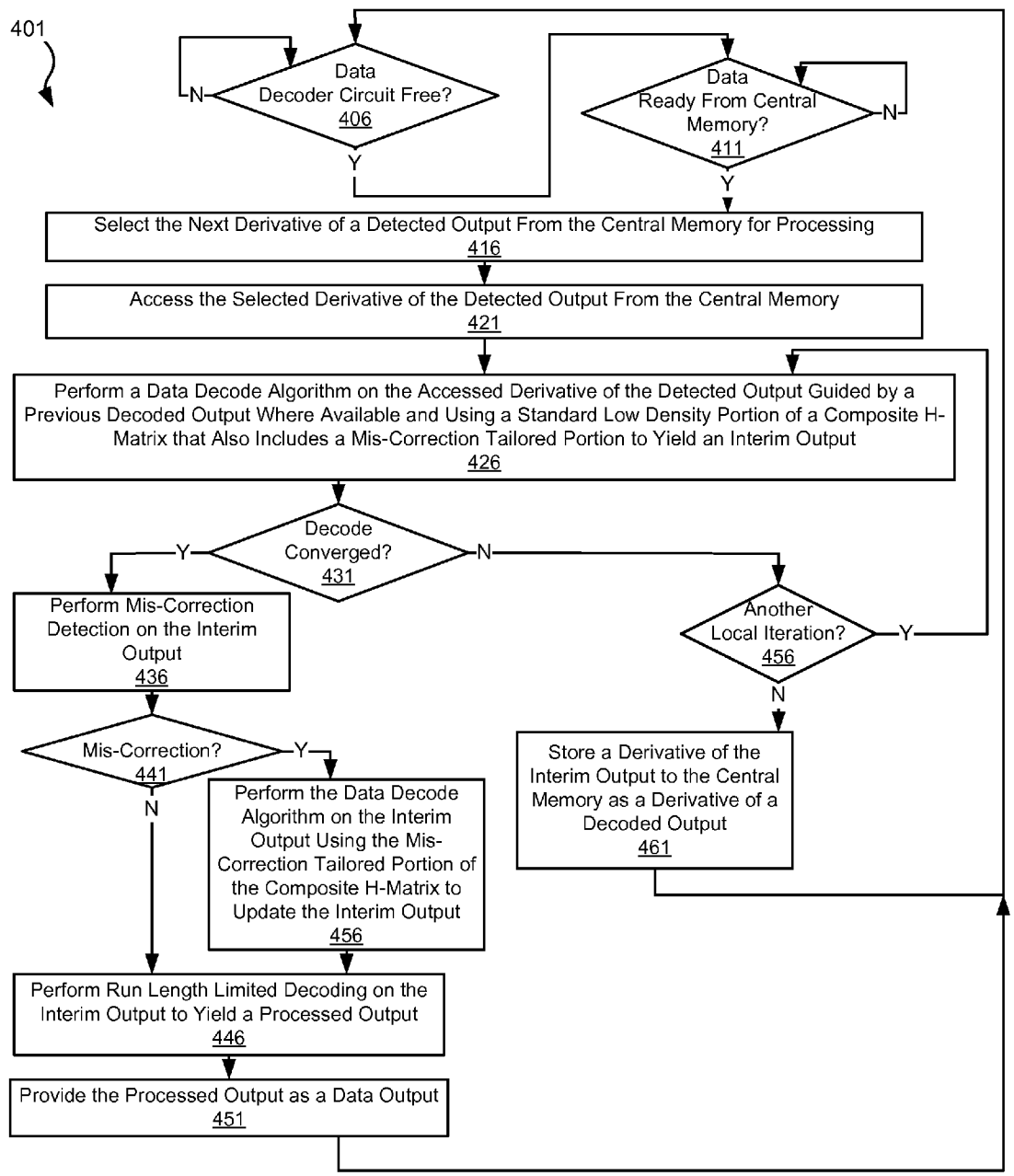

Turning to FIGS. 4a-4c, flow diagrams 400, 401, 402 show a method for data processing utilizing mis-correction detection and modification in accordance with some embodiments of the present invention. Turning to FIG. 4a, a flow diagram 402 shows a method for encoding a data set using a G-matrix that includes a mis-correction tailored portion. Following flow diagram 402, it is determined whether write data is received (block 407). The write data may be received from a host (not shown) or other source, and may be intended for transfer to, for example, a storage medium or receiver. Based upon the disclosure provided herein, one of ordinary skill in the art will recognize a variety of sources for the write data, and a variety of recipients of the processed write data. Where data is received (block 407) a first level of encoding is applied to yield a first level encoded output (block 427). In some embodiments of the present invention, the first level encoding is a run length limited encoding as is known in the art. Based upon the disclosure provided herein, one of ordinary skill in the art will recognize a variety of encodings that may be applied as part of the first level encoding in accordance with different embodiments of the present invention.

A low density parity check encoding is applied to the first level encoded output using a composite G-matrix that includes a standard low density G-matrix and a mis-correction tailored G-matrix to yield a codeword (block 437). The standard low density G-matrix may be any low density parity check encoding generation matrix known in the art. The mis-correction tailored G-matrix is designed has such that it exhibits the smallest m (m corresponds to the number of cyclic redundancy correction bits included in the data) and can recover up to a defined number (k) sparse vectors. The codeword is then transferred to a recipient (block 447). As set forth above, the recipient may be any number of devices or circuits including, but not limited to, a storage medium or a receiver. Based upon the disclosure provided herein, one of ordinary skill in the art will recognize a number of recipients that may be used in relation to different embodiments of the present invention.

Turning to FIG. 4b, flow diagram 400 shows a method in accordance with some embodiments of the present invention for applying data detection to a received codeword. Following flow diagram 400, a data set is received (block 480) and stored in an input buffer (block 485). This received data set corresponds to the codeword provided from flow diagram 400 and may be derived from, for example, a storage medium, or a communication medium via a transmitter. Based upon the disclosure provided herein, one of ordinary skill in the art will recognize a variety of sources of the received data. It is determined whether a data set is ready in the input buffer (block 405). A data set may be considered ready when an entire codeword is available in the input buffer, or when a sufficient part of a codeword is in the input buffer such that a data detection algorithm can run continuously to the end of the codeword as it becomes available in the input buffer. Where a data set is ready (block 405), it is determined whether a data detector circuit is available to process the data set (block 410). The data detector circuit may be, for example, a Viterbi algorithm data detector circuit or a maximum a posteriori data detector circuit as are known in the art Where the data detector circuit is available for processing (block 410), the next data set in the input buffer is selected for processing (block 415). The selection of the next data set may be done in accordance with any scheduling or priority scheme known in the art. The selected data set is accessed from the input buffer (block 420). Where this is the second or later global iteration for the selected data set, a corresponding decoded output is also accessed from the central memory. A data detection algorithm is then applied to the accessed data set to yield a detected output (block 425). Where it is a second or later global iteration for the accessed data set, the corresponding decoded output is used to guide application of the data detection algorithm. The data detection algorithm may be, but is not limited to, a maximum a posteriori data detection algorithm or a Viterbi data detection algorithm. Based upon the disclosure provided herein, one of ordinary skill in the art will recognize a variety of data detection algorithms that may be used in relation to different embodiments of the present invention. A derivative of the detected output is stored to the central memory (block 430). The derivative of the detected output may be, for example, an interleaved or shuffled version of the detected output.

Turning to FIG. 4c, flow diagram 401 shows a method for data decoding in accordance with one or more embodiments of the present invention. Following flow diagram 401, it is determined in parallel to the previously described data detection process of FIG. 4b whether a data decoder circuit is available to process a new data set (block 406). Where a data decoder circuit is available to process (block 406), it is determined whether a derivative of a detected output is available for processing in the central memory (block 411). Where such a data set is ready (block 411), the next derivative of a detected output is selected for processing (block 416). The selection of the next derivative of the detected output may be done in accordance with any scheduling or priority scheme known in the art. The selected derivative of the detected output is accessed from the central memory (block 421).

A data decode algorithm is applied to the accessed detected output using a standard low density portion of a composite H-matrix to yield an interim output (block 426). Where a previous local iteration has been performed on the received codeword, the results of the previous local iteration (i.e., a previous decoded output) are used to guide application of the decode algorithm. Where a previous local iteration has not been performed on the received codeword, the results of the previous local iteration (i.e., a previous decoded output) are not available and therefore are not used to guide application of the decode algorithm.

It is then determined whether the decoded output converged (i.e., resulted in the originally written data) (block 431). Where the decoded output converged (i.e., all of the parity check equations are resolved) (block 431), a mis-correction detection is applied to the interim output to determine whether the interim output includes one or more mis-corrections (block 436). In some embodiments of the present invention, mis-correction detection is done using a number of cyclic redundancy check bits, or other additional parity check information included in the data. Where no mis-corrections are detected (block 441), run length limited decoding is applied to the interim output to yield a processed output (block 446). Alternatively, where mis-corrections are detected (block 441), a secondary data decode using the mis-correction tailored portion of the composite H-matrix is performed to update the interim output (block 456) prior to applying the run length decoding to yield the processed output (block 446). The processed output is then provided as a data output (block 451).

The secondary decode (block 456) operates to correct the identified mis-corrections. The secondary decoding algorithm relies on the mis-correction tailored stage ($\phi$) of the composite H-matrix. In particular, the compressed sensing operates to determine which sparse solution to the following equation $$\arg\min_{e:e\phi=y}\|e\|_{l_0}$$

for the $l_0$ (i.e., the norm vector) that yields the minimum. This minimum corresponds to the minimum number (m) of cyclic redundancy cyclic redundancy check bits included in the interim output. For this to work, the mis-correction tailored stage ($\phi$) of the composite H-matrix is designed such that it exhibits the smallest m that is capable of recovering up to k sparse vectors. The value for the vector e that solves the above mentioned equation corresponds to a corrected output (i.e., the interim output plus e) that becomes the updated interim output. Any of a number of algorithms known in the art that are capable of solving or estimating the above mentioned vector e. For example, in one embodiment of the present invention, a basis pursuit algorithm as is known in the art is used to determine the value of the vector e. Based upon the disclosure provided herein, one of ordinary skill in the art will recognize other algorithms that may be used in relation to different embodiments of the present invention.

Alternatively, where the decoded output failed to converge (i.e., all of the parity check equations were not satisfied) (block 431), it is determined whether another local iteration is desired (block 456). In some cases, four local iterations (i.e., applications of the data decode algorithm) are allowed per each global iteration (applications of a combination of the data detection algorithm and corresponding applications of the data decode algorithm). Based upon the disclosure provided herein, one of ordinary skill in the art will recognize another number of local iterations that may be used in relation to different embodiments of the present invention. Where another local iteration is desired (block 456), the processes beginning at block 426 are repeated for the codeword. In contrast, where another local iteration is not desired (block 456), a derivative of the decoded output is stored to the central memory (block 461). The derivative of the decoded output being stored to the central memory triggers the data set ready query of block 405 to begin the data detection process.

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for prioritizing data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system, the data processing system comprising:
    a multi-level decoder circuit including:
        a first decoder circuit operable to apply a first decoding algorithm to a decoder input guided by a first portion of a composite matrix to yield an interim output;
        a second decoder circuit operable to apply a second decoding algorithm to the interim output guided by a second portion of the composite matrix when the first decoder circuit indicates the interim output is error free, wherein the second decoding algorithm is operable to correct at least one mis-correction made by the first decoder circuit in the interim output.

2. The data processing system of claim 1, wherein the second portion of the matrix exhibits the smallest number of error detection bits for a given number of sparse vectors.

3. The data processing system of claim 2, wherein the second decoding algorithm is a compressed sensing algorithm.

4. The data processing system of claim 3, wherein the compressed sensing algorithm operates to identify a vector e that corresponds to the minimum number for the normal vector $l_0$ in satisfaction of the following mathematical identity:

$$\arg\min_{e:e\phi=y}\|e\|_{l_0},$$

wherein $\phi$ represents the second portion of the matrix.

5. The data processing system of claim 1, wherein the second portion of the matrix is more than twice as dense at the first portion of the matrix.

6. The data processing system of claim 1, wherein the first decoding algorithm is a low density parity check encoding algorithm.

7. The data processing system of claim 1, wherein the system further comprises:
    a data detector circuit operable to apply a data detection algorithm to an input data set to yield a detected output; and
    wherein the decoder input is derived from the detected output.

8. The data processing system of claim 7, wherein the data detection algorithm is selected from a group consisting of: a Viterbi algorithm detection algorithm, and a maximum a posteriori data detection algorithm.

9. The data processing system of claim 1, wherein the system is implemented as an integrated circuit.

10. The data processing system of claim 1, wherein the data processing system is incorporated in a device selected from a group consisting of: a storage device, and a data communication device.

11. The data processing system of claim 1, wherein the matrix is an H-matrix, and wherein the system further comprises:
    an encoding circuit operable to encode a received data set using a composite G-matrix corresponding to the composite H-matrix to yield a codeword.

12. The data processing system of claim 11, wherein the decoder input is derived from the codeword.

13. The data processing system of claim 1, wherein the data processing system is implemented as part of a storage device, and wherein the storage device further comprises:
    a storage medium;
    a head assembly disposed in relation to the storage medium and operable to:
        write a codeword on the storage medium; and
        provide a sensed signal corresponding to the codeword on the storage medium;
    a write circuit including:
        an encoder circuit operable to encode a received write data to yield the codeword to be stored to the storage medium;
    a read circuit including:
        the multi-level decoder circuit, wherein the decoder input corresponds to the codeword.

14. A method for data processing, the method comprising:
    receiving a decoder input;

applying a first data decode algorithm to the decoder input guided by a first portion of a composite matrix to yield an interim output;

determining that the interim output includes at least one mis-correction wherein the mis-correction occurs when a successful result from the application of the first decoding algorithm is indicated even though the interim output includes differences from an originally encoded data set; and based on determining that the interim output includes at least one mis-correction, applying a second decoding algorithm decoded by a second portion of the composite matrix to yield a decoded output, wherein application of the second decoding algorithm is operable to correct the at least one mis-correction in the interim output.

15. The method of claim 14, wherein the interim output includes correction data, and wherein the method further comprises:

using the correction data to determine that the at least one mis-correction exists in the interim output.

16. The method of claim 14, wherein the second portion of the matrix exhibits the smallest number of error detection bits for a given number of sparse vectors, and wherein the second portion of the matrix is more than twice as dense at the first portion of the matrix.

17. The method of claim 14, wherein the second decoding algorithm is a compressed sensing algorithm.

18. The method of claim 17, wherein the compressed sensing algorithm operates to identify a vector e that corresponds to the minimum number for the normal vector $l_0$ in satisfaction of the following mathematical identity:

$$\arg\min_{e:e\phi=y} \|e\|_{l_0},$$

wherein $\phi$ represents the second portion of the matrix.

19. A data processing system, the data processing system comprising:

a multi-level decoder circuit including:
  a first decoder circuit operable to apply a first decoding algorithm to a decoder input guided by a first portion of a composite matrix to yield an interim output;
  a mis-correction detection circuit operable to detect a mis-correction in the interim output after the first decoder circuit indicates convergence of the interim output;
  a second decoder circuit operable to apply a second decoding algorithm to the interim output guided by a second portion of the composite matrix only when the mis-correction is detected in the interim output.

20. The data processing system of claim 19, wherein the data processing system is implemented as part of a storage device, and wherein the storage device further comprises:

a storage medium;

a head assembly disposed in relation to the storage medium and operable to:
  write a codeword on the storage medium; and
  provide a sensed signal corresponding to the codeword on the storage medium;

a write circuit including:
  an encoder circuit operable to encode a received write data to yield the codeword to be stored to the storage medium;

a read circuit including:
  the multi-level decoder circuit, wherein the decoder input corresponds to the codeword.

* * * * *